US006468837B1

United States Patent
Pendharkar et al.

(10) Patent No.: US 6,468,837 B1
(45) Date of Patent: Oct. 22, 2002

(54) REDUCED SURFACE FIELD DEVICE HAVING AN EXTENDED FIELD PLATE AND METHOD FOR FORMING THE SAME

(75) Inventors: Sameer P. Pendharkar, Plano; Taylor R. Efland, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 09/630,594

(22) Filed: Aug. 1, 2000

Related U.S. Application Data

(62) Division of application No. 09/196,879, filed on Nov. 20, 1998, now Pat. No. 6,160,290.
(60) Provisional application No. 60/066,894, filed on Nov. 25, 1997.

(51) Int. Cl.[7] .............................................. H01L 21/332
(52) U.S. Cl. ...................... 438/140; 438/151; 438/286; 257/328; 257/336; 257/339; 257/342; 257/409
(58) Field of Search .................. 257/339, 342, 257/409, 492; 438/151

(56) References Cited

U.S. PATENT DOCUMENTS

| 5,168,335 A | * | 12/1992 | D'Arrigo et al. |
| 5,246,870 A | * | 9/1993 | Merchant |
| 5,300,448 A | * | 4/1994 | Merchant et al. |
| 5,304,827 A | * | 4/1994 | Malhi et al. |
| 5,378,912 A | * | 1/1995 | Pein |
| 5,430,316 A | * | 7/1995 | Contiero et al. |
| 5,627,394 A | * | 5/1997 | Chang et al. |
| 5,670,396 A | * | 9/1997 | Shibib |
| 5,747,850 A | * | 5/1998 | Mei |
| 5,981,997 A | * | 11/1999 | Kitamura |

OTHER PUBLICATIONS

Tomohide et al., A New Level–shifting Technique by divided RESURF Structure, (IEEE), pp. 57–60, 1997.*
Ravishankar et al., High Temperature Performance of Dielectrically Isolated LDMOSFET: Characterization, Simulation and Analysis, (IEEE), pp. 359–360, 1994.*
Terashima et al., Over 1000V n–ch LDMOSFET and p–ch LIGBT with JI RESURF Structure and Multiple Floating Field Plate, (IEEE), pp. 455–459, 1995.*

* cited by examiner

Primary Examiner—Long Pham
Assistant Examiner—Scott A Brairton
(74) Attorney, Agent, or Firm—Wade James Brady, III; Frederick J. Telecky, Jr.

(57) ABSTRACT

A semiconductor device (10) comprises a reduced surface field (RESURF) implant (14). A field oxide layer (20), having a length, is formed over the RESURF implant (14). A field plate (12) extends from a near-side of the field oxide layer (20) and over at least one-half of the length of the field oxide layer (20).

17 Claims, 3 Drawing Sheets

US 6,468,837 B1

REDUCED SURFACE FIELD DEVICE HAVING AN EXTENDED FIELD PLATE AND METHOD FOR FORMING THE SAME

CROSS REFERENCE TO PRIOR APPLICATIONS

This application is a division of Ser. No. 09/196,879, filed Nov. 20, 1998, now U.S. Pat. No. 6,160,290 which claims priority under 35 U.S.C. 119(e) based upon Provisional Application Ser. No. 60/066,894, filed Nov. 25, 1997.

TECHNICAL FIELD OF THE INVENTION

This invention relates generally to the field of integrated circuits, and more particularly, to a reduced surface field (RESURF) device having an extended field plate and method for forming the same.

BACKGROUND OF THE INVENTION

A reduced surface field (RESURF) semiconductor device comprises a shallow n-type region doped or implanted into an epitaxial layer. In such RESURF devices, high breakdown voltage ($Bv_{dss}$) can be achieved during OFF-state operation. Accordingly, these devices are attractive for various applications, such as building cost effective, intelligent power designs, as they are smaller than other devices used for power applications and can therefore reduce the area needed for a power device. Previously, in order to provide a higher breakdown voltage in a RESURF device, the doping of the RESURF implant was decreased. However, this technique also introduced numerous undesirable electrical properties into the semiconductor device, such as, for example, increasing the ON-state resistance of the device, and hence, response time. Thus, prior designs of RESURF semiconductor devices were a compromise of various desired characteristics.

SUMMARY OF THE INVENTION

Accordingly, a need has arisen for a reduced surface field semiconductor device and method of fabrication that addresses the shortcomings of the prior reduced surface field semiconductor devices and methods of fabrication.

According to an embodiment of the present invention, a semiconductor device comprises a reduced surface field (RESURF) implant. A field oxide layer, having a length, is formed over the RESURF implant. A field plate extends from a near-side of the field oxide layer and over at least one-half of the length of the field oxide layer.

According to another embodiment of the present invention, a semiconductor device comprises a reduced surface field (RESURF) implant. A field oxide layer is formed over the RESURF implant as a LOCOS structure having a near-side bird's beak and a far-side bird's beak. The field oxide layer has a length defined as the distance between the near-side bird's beak and the far-side bird's beak. A field plate extends from the near-side bird's beak and over at least one-half of the length of the field oxide layer.

According to yet another embodiment of the present invention, a method for forming a semiconductor device comprises the following steps: forming a reduced surface field (RESURF) implant in an epitaxial layer; forming a field oxide layer over the RESURF implant, the field oxide layer having a length; and forming a field plate over at least a portion of the field oxide layer, the field plate extending from a near-side of the field oxide layer and over at least one-half of the length of the field oxide layer.

An important technical advantage of the present invention includes providing a reduced surface field (RESURF) semiconductor device having a field plate which extends over at least half the length of a field oxide layer beginning from the side of the field oxide layer adjacent or nearest to a gate of the semiconductor device. In one embodiment, the field oxide layer may be formed as a LOCOS (LOCal Oxidation of Silicon) structure having a near-side bird's beak proximate the gate and a far-side bird's beak proximate a drain of the semiconductor device; the field plate can be extended up to one alignment tolerance of the far-side bird's beak of the field oxide layer. Such an extended field plate provides higher breakdown voltage in the OFF-state of the semiconductor device, while not substantially increasing resistance in the ON-state. Thus, there is no need to compromise between various desirable characteristics when designing or forming the semiconductor device. Other important technical advantages of the present invention are readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

The preferred embodiment of the present invention and its advantages are best understood by referring to FIGS. 1 and 2A–2I of the drawings, like numerals being used for like and corresponding parts of the various drawings.

Figure 1:
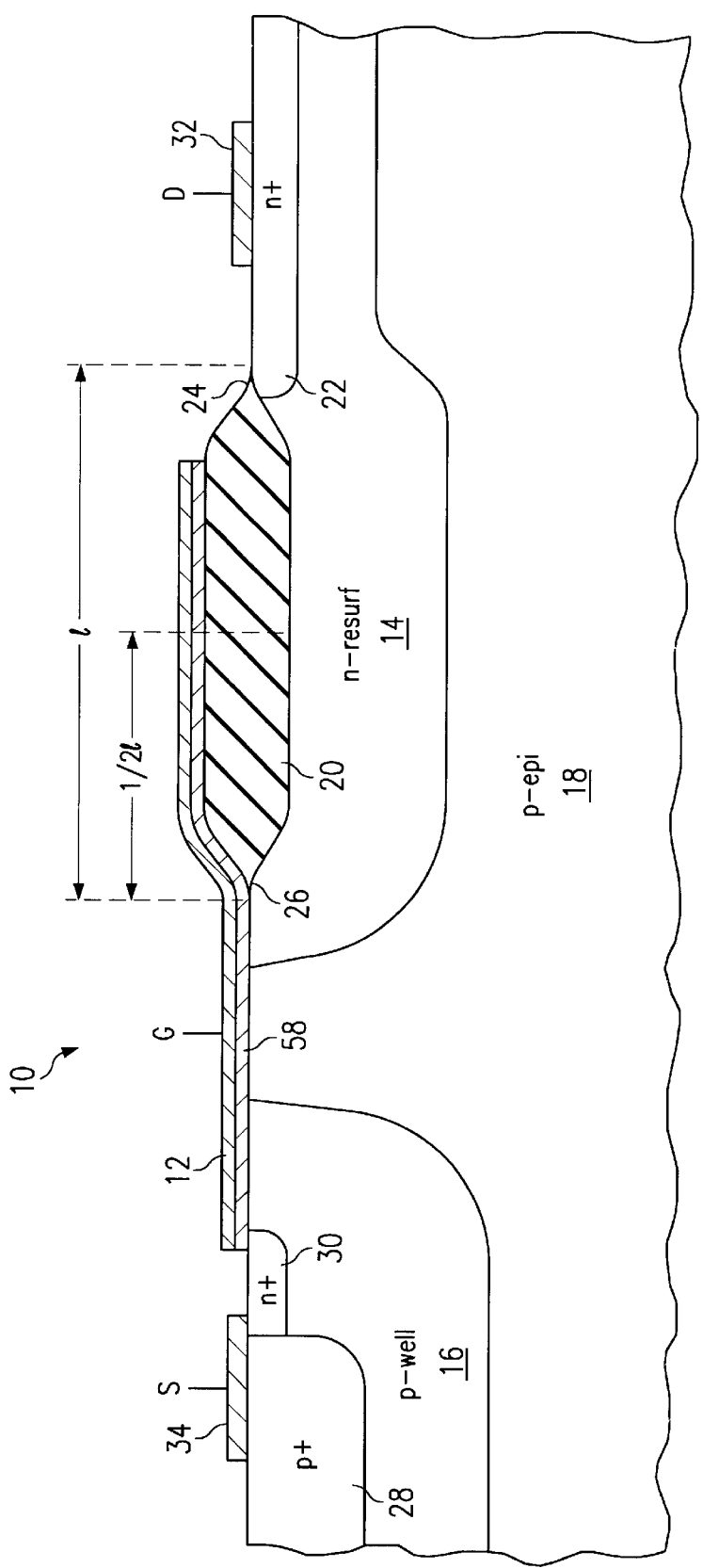
FIG. 1 is a sectional view of a reduced surface field (RESURF) semiconductor device having an extended field plate, in accordance with an embodiment of the present invention.

FIG. 1 is a sectional view illustrating a reduced surface field (RESURF) semiconductor device 10 having an extended field plate 12, according to an embodiment of the present invention. As shown, semiconductor device 10 comprises a lateral double diffused metal-oxide-semiconductor field effect transistor (LDMOSFET) device. Such device can be operated in either an ON-state or an OFF-state.

In RESURF semiconductor device 10, an N– RESURF region 14 and a P– well 16 are situated within a P– epitaxial layer 18. P– epitaxial layer 18 may comprise a doped, crystalline structure of silicon (Si), gallium arsenide (GaAs), or other semiconducting material, formed on a silicon crystal wafer, for example, by vapor phase epitaxy (VPE), liquid phase epitaxy (LPE), or other suitable methods. N– RESURF region 14 may be a doped region in P– epitaxial layer 18; N– RESURP region 14 can be formed by ion implantation and diffusion of a suitable material, such as phosphorous (P), arsenic (As), or antimony (Sb). Similarly, P– well 16 may also be a doped region formed in P– epitaxial layer 18 by implantation and diffusion of a suitable material.

A field oxide layer 20 and an N+ region 22 may be disposed in and/or over N– RESURF region 14. Field oxide layer 20 can be formed as LOCOS (LOCal Oxidation of Silicon) structure having a drain side bird's beak 24 and a gate side bird's beak 26. Gate side bird's beak 26 may also be referred to as a "near-side" bird's beak due to its close proximity to the gate; the drain side bird's beak 24 may be also referred to as a "far-side" bird's beak due to its location opposite the gate. Field oxide layer 20 has a length, designated by "1" in FIG. 1, which can be defined as the distance from the near-side bird's beak to the far-side bird's beak. In another embodiment, field oxide layer 20 can be formed as an "etched field oxide" structure.

N+ region 22 may be doped into N– RESURF region 14. A P+ region 28 and N+ region 30 may be disposed in P– well 16. Each of P+ region 28 and N+ region 30 can be formed by doping. A drain connector 32 is disposed over N+ region 22 (within N– RESURF region 14) for providing electrical contact thereto. A source connector 34 connects P+ region 28 and N+ region 30.

Field plate 12 is disposed over portions of N+ region 30, P– well 16, P– epitaxial layer 18, N– RESURF region 14, and field oxide layer 20. Field plate 12, comprising polysilicon or any other suitable material, may serve as a gate connector for RESURF device 10.

In accordance with the present invention, field plate 12 extends from the near-side (i.e., proximate the gate) and over at least one-half the length 1 of field oxide layer 20. This minimum distance for field plate extension is designated by "½ l" in FIG. 1. In one embodiment, field plate 12 is extended up to one alignment tolerance of the drain side bird's beak 24 on the far-side of field oxide layer 20. It should be understood that such alignment tolerance is inherently defined by the processes and materials from which field plate 12 and field oxide layer 20 are formed. Because different processes and materials yield different alignment tolerances, specific dimensions are not given. Regardless, these dimensions are not critical to practicing the present invention.

With the extended field plate 12 shown in FIG. 1, higher breakdown voltage can be achieved for semiconductor device 10 in the OFF-state, without substantially increasing electrical resistance during the ON-state. Accordingly, device breakdown can be optimized without adversely affecting response time. Thus, unlike previous techniques in which the doping of the RESURF implant was decreased, the present invention does not require a compromise between various desirable properties.

FIGS. 2A–2I are sectional views illustrating a method of forming a reduced surface field semiconductor device having an extended field plate (such as RESURF device 10 illustrated in FIG. 1), in accordance with an embodiment of the present invention. For clarity, some of the regions of such RESURF semiconductor device have been omitted from FIGS. 2A–2I.

Figure 2A:
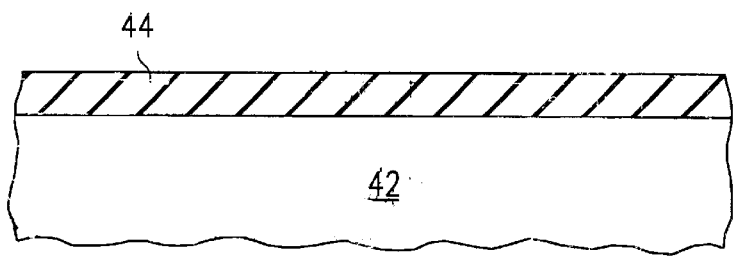
FIGS. 2A–2I are sectional views illustrating a method of forming a RESURF semiconductor device having an extended field plate, in accordance with an embodiment of the present invention.

With reference to FIG. 2A, the method of formation begins with a semiconductor structure having an epitaxial layer 42 and a nitride layer 44. The epitaxial layer 42 may be formed by epitaxial growth on a silicon wafer. The nitride layer 44 may be formed by deposition upon epitaxial layer 42.

Figure 2B:
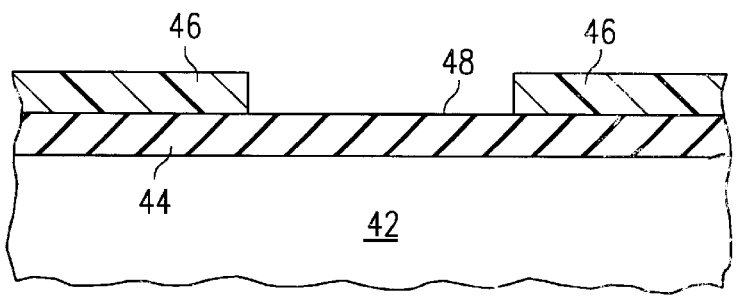
Figure 2C:
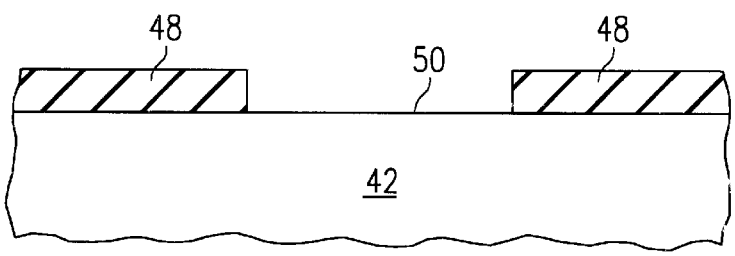

Upon the structure shown in FIG. 2A, a mask layer 46 of photoresist may be deposited to form the structure shown in FIG. 2B. This mask layer 46 may only partially cover nitride layer 44 in the semiconductor structure, leaving a portion of nitride layer 44 exposed at an area 48. The mask layer 46 and the portion of nitride layer 44 exposed at area 48 are removed to produce the structure illustrated in FIG. 2C. This can be accomplished with an etching process followed mask removal. As shown, a portion of epitaxial layer 42 is exposed at an area 50.

Figure 2D:
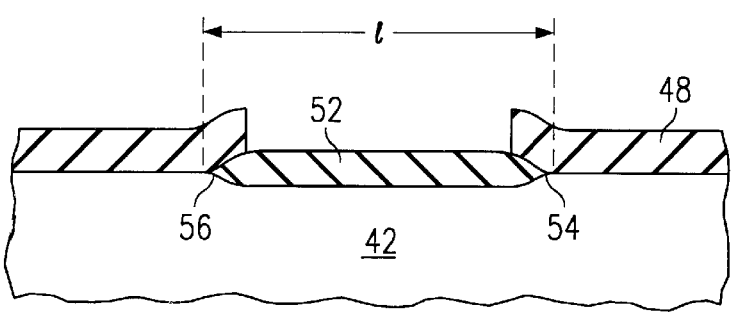
Figure 2E:
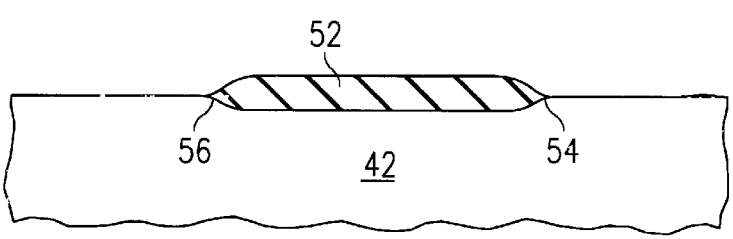

Next, a field oxide layer 52 can be formed at the exposed area 50 of epitaxial layer 42, for example, by an oxidation and diffusion process. In one embodiment, an anneal process can be utilized. The resultant structure is illustrated in FIG. 2D. Field oxide layer 52 may comprise a LOCOS (LOCal Oxidation of Silicon) structure with a far-side bird's beak 54 and a near-side bird's beak 56 proximate nitride layer 48 at opposing ends. Field oxide layer 52 has a length l, which can be defined as the distance from near-side bird's beak 56 to far-side bird's beak 54. The remainder of the nitride layer 48 can be removed, for example, utilizing a nitride strip, to produce the structure illustrated in FIG. 2E.

In an alternative embodiment (not illustrated), the field oxide layer can be formed as an "etched field oxide" structure. For this embodiment, a layer of oxide material may be deposited and then selectively etched using a photoresist mask.

Figure 2F:
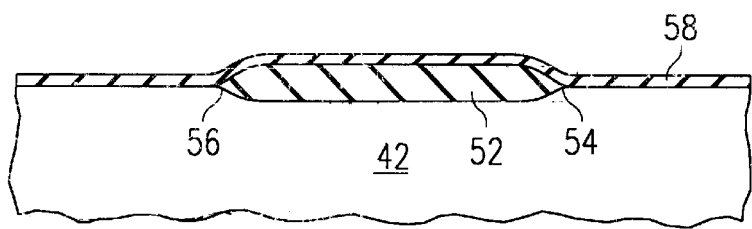
Figure 2G:
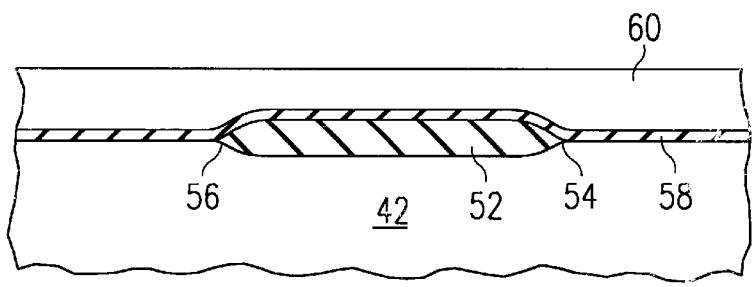
Figure 2H:
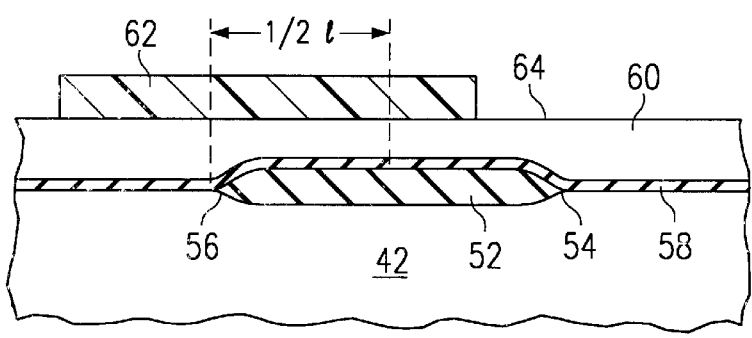

Next, a thin gate oxide layer 58 is formed over the surface of structure 40, as illustrated in FIG. 2F. This can be accomplished using a diffusion process for growth of gate oxide layer 58. In FIG. 2G, it is shown that a polysilicon layer 60 may be formed, for example, by polysilicon deposition, over thin gate oxide layer 58.

A mask layer 62 of photoresist may be deposited over portions of the polysilicon layer 60. This produces the structure illustrated in FIG. 2H. In accordance with the present invention, mask layer 62 extends from a near-side of field oxide layer 52 (proximate bird's beak 56) and covers at least one half the length of field oxide layer 52. The minimum distance for extension of the mask layer 62 is designated by "½ l". In one embodiment, mask layer 62 can be extended to within one alignment tolerance of the far-side bird's beak 56. This alignment tolerance is inherent to the processes and materials which are used to produce field oxide layer 52 and mask layer 62; accordingly, specific dimensions are not given herein. At an area 64, at least a portion of the polysilicon layer 60 is not covered by mask layer 62.

An etch process may then be utilized to remove at least a portion of the polysilicon layer 60 at exposed area 64. Mask layer 62 may then be removed, for example, by a mask removal process, to produce the structure illustrated in FIG. 2I. This structure has a field plate 66 which extends from the near-side of field oxide layer 52 and covers at least one half the length of field oxide layer 52. In one embodiment, field plate 66 may extend up to one alignment tolerance of far-side bird's beak 54. The amount by which field plate 66 extends over field oxide layer 52 is defined by the mask layer 62 shown in FIG. 2H.

Figure 2I:
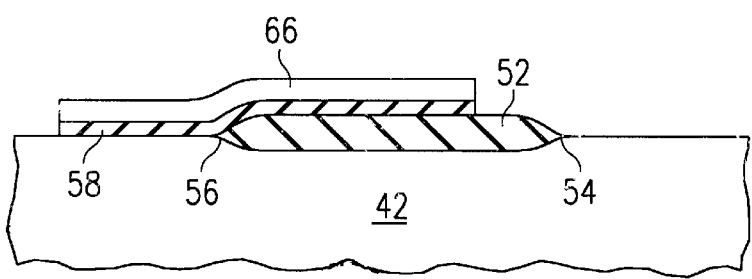

The semiconductor structure shown in FIG. 2I provides numerous technical advantages. For example, a reduced surface field (RESURF) implant can be formed therein for achieving high breakdown voltage ($Bv_{dss}$) in an OFF-state, while yielding no substantial increase in resistance in the ON-state. Accordingly, unlike prior techniques, the method of the present invention optimizes device breakdown without adversely affecting response time of the semiconductor device.

Although the present invention and its advantages have been described in detail, it should be understood that various changes, substitutions, and alterations can be made herein without departing from the spirit and scope of the invention, as defined by the appended claims.

What is claimed is:

1. A method for forming a semiconductor device comprising the steps of:

providing a semiconductor layer of first conductivity type;

forming a reduced surface field (RESURF) implant region in said semiconductor layer of opposite conductivity type;

forming a field oxide layer over and entirely within the RESURF implant region, the field oxide layer having a length defined as the distance between a near end and a far end of the field oxide layer;

forming a gate oxide layer over the portion of the resurf implant region extending from said near end region of said field oxide layer and over said semiconductor layer;

forming an electrically conductive field plate extending from a near-side of the field oxide layer and over at least one-half of the length of the field oxide layer as well as over the portion of said gate oxide layer disposed over said layer semiconductor layer and terminating on said field oxide layer and on said gate oxide layer;

forming a drain region disposed in said RESURF implant region; and forming a source region disposed in said layer of semiconductor material and spaced from said RESURF implant region to define the portion of said layer of semiconductor material over which said gate oxide is disposed.

2. The method of claim 1, wherein the step of forming the field plate comprises the steps of:

depositing a polysilicon layer over the field oxide layer; and depositing a mask layer over at least a portion of the polysilicon layer, the mask layer extending from the near-side of the field oxide layer and over at least one-half of the length of the field oxide layer.

3. The method of claim 2, wherein the step of forming the field plate further comprises the step of etching away a portion of the polysilicon layer not covered by the mask layer.

4. The method of claim 1, wherein the field plate extends to one alignment tolerance at a far-side of the field oxide layer.

5. The method of claim 1, wherein the step of forming the field oxide layer comprises forming a local oxidation of silicon (LOCOS) structure having a near-side bird's beak and a far-side bird's beak.

6. The method of claim 5, wherein the step of forming the field plate comprises forming the field plate so that the field plate extends to a point proximate one alignment tolerance of the far-side bird's beak of the LOCOS structure.

7. A method of forming a semiconductor device comprising the steps of:

providing a layer of semiconductor material of a first conductivity type;

forming a reduced surface field (RESURF) implant region in said layer of semiconductor material of opposite conductivity type;

forming a field oxide layer disposed over the RESURF implant having a near-side bird's beak and a far-side bird's beak, the field oxide layer having a length defined as the distance between the near-side bird's beak and the far-side bird's beak;

forming a gate oxide layer disposed over the portion of the RESURF implant region extending from said near-side bird's beak of said field oxide layer and over said layer of semiconductor material;

forming an electrically conductive field plate extending from the near-side bird's beak and over at least one-half of the length of the field oxide layer as well as over the portion of said gate oxide layer disposed over said layer of semiconductor material and terminating on said field oxide layer and on said gate oxide layer;

forming a drain region disposed in said RESURF implant region; and forming a source region disposed in said layer of semiconductor material and spaced from said RESURF implant region to define the portion of said layer of semiconductor material over which said gate oxide is disposed.

8. The method of claim 7 wherein the field plate extends to a point proximate one alignment tolerance of the far-side of the field oxide.

9. The method of claim 7 wherein the near-side bird's beak is located proximate a gate for the semiconductor device.

10. A method of forming a semiconductor device comprising the steps of:

providing a region of semiconductor material of a first conductivity type having a surface;

implanting a region in said layer of semiconductor material of opposite conductivity type extending to said surface;

forming a field oxide layer disposed over and entirely within the implant region, the field oxide layer having a far end and a near end on a side of said field oxide layer opposite said far end, the length of said field oxide defined as the distance between said near end and said far end of said field oxide layer;

forming a gate oxide layer disposed over the surface portion of said implant region extending from said near end region of said field oxide layer and over said surface of said layer of semiconductor material;

forming a field plate extending from a near-side of the field oxide layer and over at least one-half of the length of the field oxide layer as well as over the portion of said gate oxide layer disposed over said layer of semiconductor material terminating on said field oxide layer and on said gate oxide layer;

forming a drain region disposed in said implant region; and forming a source region disposed in said layer of semiconductor material and spaced from said implant region to define the portion of said layer of semiconductor material over which said gate oxide is disposed.

11. The method of claim 10 further including the step of providing a well of said first conductivity type disposed in said layer of semiconductor material of said first conductivity type spaced from said implant region and containing said source region therein.

12. The method as set forth in claim 11 wherein said source region includes a region of said first conductivity type more highly doped than said well of said first conductivity type extending to said surface and a region of opposite conductivity type extending to said surface.

13. The method of claim 12 wherein said field plate extends over said well of said first conductivity type and said region of opposite conductivity type in said well of said first conductivity type.

14. The method of claim 10 wherein the field plate extends to one alignment tolerance at a far side of the field oxide layer.

15. The method of claim 11 wherein the field plate extends to one alignment tolerance at a far side of the field oxide layer.

16. The method of claim 12 wherein the field plate extends to one alignment tolerance at a far side of the field oxide layer.

17. The method of claim 13 wherein the field plate extends to one alignment tolerance at a far side of the field oxide layer.

* * * * *